(12) United States Patent
Sundaram et al.

(10) Patent No.: US 11,237,903 B2
(45) Date of Patent: Feb. 1, 2022

(54) TECHNOLOGIES FOR PROVIDING ECC PRE-PROVISIONING AND HANDLING FOR CROSS-POINT MEMORY AND COMPUTE OPERATIONS

(71) Applicant: Intel Corporation, Santa Clara, CA (US)

(72) Inventors: Rajesh Sundaram, Folsom, CA (US); Wei Wu, Portland, OR (US); Chetan Chauhan, Folsom, CA (US); Srikanth Srinivasan, Portland, OR (US); Shigeki Tomishima, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 169 days.

(21) Appl. No.: 16/451,545

(22) Filed: Jun. 25, 2019

(65) Prior Publication Data

US 2019/0310911 A1   Oct. 10, 2019

(51) Int. Cl.
  *G06F 11/00* (2006.01)
  *G06F 11/10* (2006.01)
  *G11C 29/52* (2006.01)

(52) U.S. Cl.
  CPC .......... *G06F 11/1068* (2013.01); *G11C 29/52* (2013.01)

(58) Field of Classification Search
  CPC .............. G06F 11/1068; G06F 11/1048; G06F 2212/403; G11C 29/52; G11C 2029/0411
  USPC ........................................ 714/758, 752, 764
  See application file for complete search history.

(56) References Cited

U.S. PATENT DOCUMENTS

| | | | | |
|---|---|---|---|---|
| 9,064,569 | B1 * | 6/2015 | Gorobets | G11C 13/0002 |
| 2008/0005646 | A1 * | 1/2008 | Bains | G06F 11/1008 |
| | | | | 714/781 |
| 2014/0245105 | A1 * | 8/2014 | Chung | G06F 11/1076 |
| | | | | 714/763 |
| 2015/0372697 | A1 * | 12/2015 | Alhussien | H03M 13/2909 |
| | | | | 714/755 |
| 2016/0092306 | A1 * | 3/2016 | Benedict | G06F 11/106 |
| | | | | 714/764 |
| 2016/0283318 | A1 * | 9/2016 | Das | G06F 11/1048 |
| 2017/0060680 | A1 * | 3/2017 | Halbert | G06F 11/1068 |
| 2017/0185480 | A1 * | 6/2017 | Choi | G06F 3/068 |
| 2017/0286197 | A1 * | 10/2017 | Halbert | G06F 11/1068 |
| 2019/0163532 | A1 * | 5/2019 | Kim | G11C 29/52 |
| 2019/0227869 | A1 * | 7/2019 | Bradshaw | H03M 13/00 |
| 2020/0387323 | A1 * | 12/2020 | Boehm | G06F 3/0616 |

* cited by examiner

*Primary Examiner* — Esaw T Abraham
*Assistant Examiner* — Osman M Alshack
(74) *Attorney, Agent, or Firm* — Compass IP Law PC

(57) ABSTRACT

Technologies for provisioning error-corrected data for use in in-memory compute operations include a memory that includes a memory media having multiple memory partitions and media access circuitry coupled to the memory media. The media access circuitry is to receive a request to perform an in-memory compute operation on data from the memory media. The request specifies a memory partition of the memory media in which the data is located. The media access circuitry reads the data from the memory partition. The media access circuitry performs error correction on the read data to produce error-corrected read data and stores the error-corrected read data in a temporary buffer for access by one or more in-memory compute operations, in addition to the requested in-memory compute operation.

20 Claims, 4 Drawing Sheets

TECHNOLOGIES FOR PROVIDING ECC PRE-PROVISIONING AND HANDLING FOR CROSS-POINT MEMORY AND COMPUTE OPERATIONS

BACKGROUND

Ensuring the reliability of data is a significant challenge for memory and storage devices. A typical approach is to perform, with a memory controller, an error correction code (ECC) process, which involves encoding (e.g., during a writing process) a data set with redundant bits and decoding (e.g., during a reading process) the data set while using the redundant bits to detect and correct errors in the data set. The memory controller may then provide the error-corrected data to a processor or other component (e.g., an accelerator device) to perform operations on the error-corrected data. To mitigate the overhead caused by the redundant bits, the size of each data set to be protected from corruption tends to be relatively large, such as two kilobits or four kilobits. However, the above scheme presents inefficiencies for architectures in which computations may be performed in the memory on the data (e.g., on a memory die, rather than by a processor or other component of a compute device). More specifically, sending data (e.g., through a bus) from the memory media on which the data resides to the memory controller to perform an error correction process and then sending the error-corrected data back from the memory controller through the bus consumes energy and time and may diminish any efficiencies that would otherwise be obtained by performing computations in the memory.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
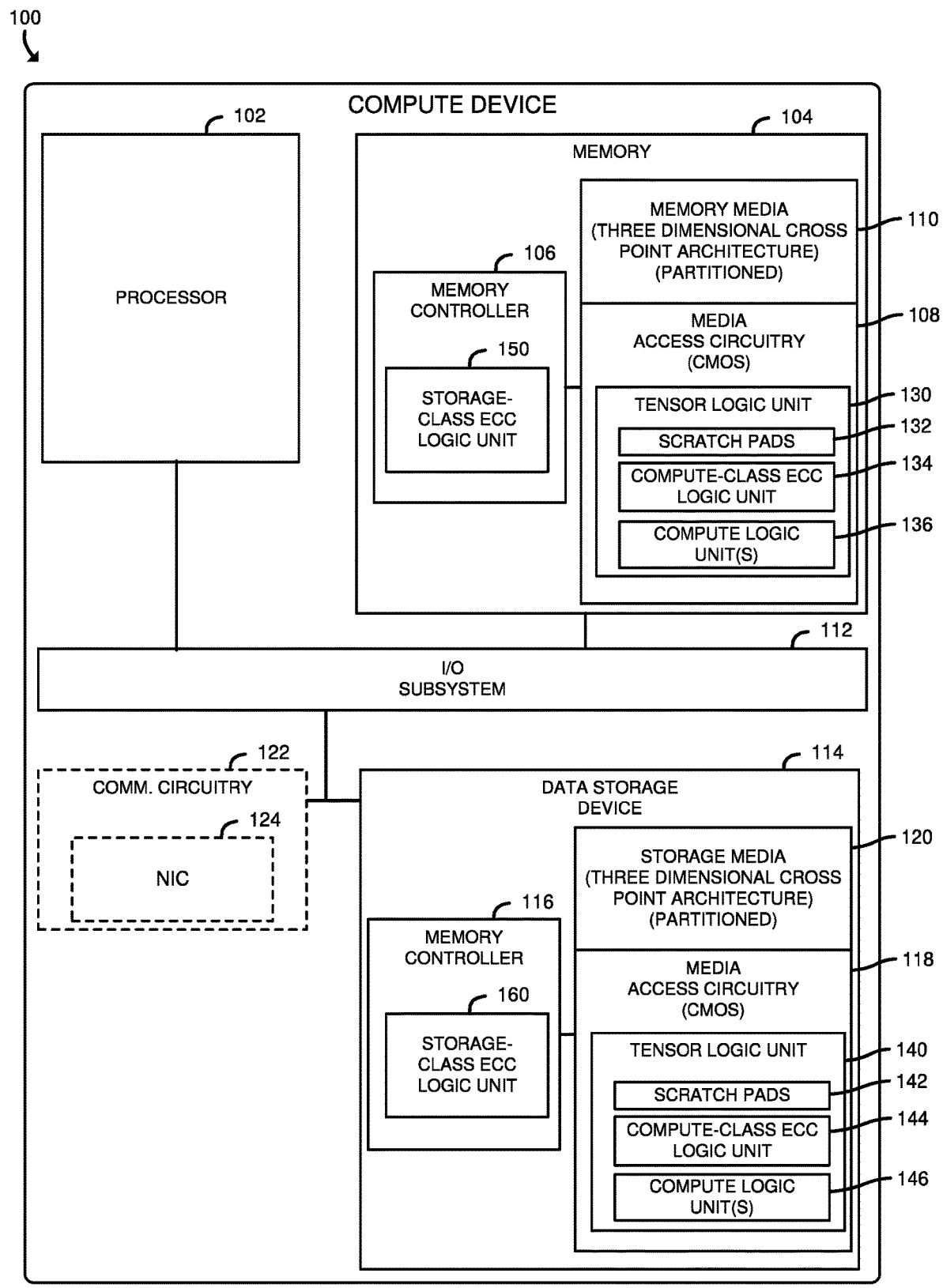
FIG. 1 is a simplified diagram of at least one embodiment of a compute device for providing multiple levels of error correction on data.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, a compute device 100 for provisioning error-corrected data for in-memory compute operations includes a processor 102, memory 104, an input/output (I/O) subsystem 112, a data storage device 114, and communication circuitry 122. Of course, in other embodiments, the compute device 100 may include other or additional components, such as those commonly found in a computer (e.g., a display, peripheral devices, etc.). Additionally, in some embodiments, one or more of the illustrative components may be incorporated in, or otherwise form a portion of, another component. The compute device 100, and in particular, the memory 104 of the compute device 100 provides multiple levels of error correction, with one level performed within media access circuitry 108 (e.g., by a compute-class ECC logic unit 134) and another level provided by a memory controller 106 (e.g., by a storage-class ECC logic unit 150). As further described herein, the media access circuitry 108, in the illustrative embodiment, is local to (e.g., on the same die, in the same package, etc.) a memory media 110 and may perform compute operations on data from the memory media 110, thereby eliminating the need for data to be sent (e.g., through a bus) to the processor 102 or another component of the compute device 100 for in-memory computations.

Because the media access circuitry 108 is located on the same die as the memory media 110 and executes compute operations on data stored in the memory media 110, it is desirable to maintain error correction operations within the die rather than require the media access circuitry 108 to send data outside the memory, such as to the memory controller 106, to perform error correction. As further described herein, to facilitate the performance of compute operations in the media access circuitry 108, the compute-class ECC logic unit 134 in the media access circuitry 108 produces an error-corrected version of data read from the memory media 110. Doing so ensures that the error correction is performed in-die and eliminates the need for sending the data, in such in-memory operations, to the memory controller 106 for error correction. Further, in producing error-corrected data, the media access circuitry 108 may make the error corrected read data accessible for other processes (e.g., other in-memory compute operations). Doing so increases efficiency of in-memory compute operations in the memory media 110.

The compute-class ECC logic unit 134 may be embodied as any device or circuitry (e.g., reconfigurable circuitry, an application specific integrated circuit (ASIC), etc.) configured to determine whether data read from the memory media 110 contains errors and to correct any errors with error correction algorithm(s), such as Reed-Solomon codes or Bose-Chaudhuri-Hocquenghem (BCH) codes. Similarly, the storage-class ECC logic unit 150 may be embodied as any device or circuitry (e.g., reconfigurable circuitry, an application specific integrated circuit (ASIC), etc.) configured to determine whether data read from the memory media 110 (e.g., sent by the media access circuitry 108) contains errors and to correct any errors with error correction algorithm(s), such as Reed-Solomon codes or Bose-Chaudhuri-Hocquenghem (BCH) codes. In the illustrative embodiment, the compute-class ECC logic unit 134 may be configured to operate on smaller data sets (e.g., 512 bits) than the storage-class ECC logic unit 150, which may operate on data sets of 2 kilobits, 4 kilobits, or other sizes. Similarly, the compute-class ECC logic unit 134 may execute a faster, less compute intensive error correction algorithm (e.g., a BCH algorithm) than an algorithm (e.g., a Reed-Solomon algorithm) executed by the storage-class ECC logic unit 150, as data corrected by the compute-class ECC logic unit 134 typically is retained in the memory for a shorter period of time (e.g., data temporarily written to memory as compute operations are performed in the memory 104), resulting in fewer errors than data corrected by the storage-class ECC logic unit 150.

The memory media 110, in the illustrative embodiment, has a three-dimensional cross point architecture that has data access characteristics that differ from other memory architectures (e.g., dynamic random access memory (DRAM)), such as enabling access to one bit per tile and incurring time delays between reads or writes to the same partition or other partitions. The media access circuitry 108 is configured to make efficient use (e.g., in terms of power usage and speed) of the architecture of the memory media 110, such as by accessing multiple tiles in parallel within a given partition, utilizing scratch pads (e.g., relatively small, low latency memory) to temporarily retain and operate on data read from the memory media 110, and broadcasting data read from one partition to other portions of the memory 104 to enable matrix calculations to be performed in parallel within the memory 104. Additionally, in the illustrative embodiment, instead of sending read or write requests to the memory 104 to access matrix data, the processor 102 may send a higher-level request (e.g., a type of matrix calculation to perform) and provide the locations and dimensions (e.g., in memory) of the matrices to be utilized in the requested operation (e.g., an input matrix, a weight matrix, and an output matrix). Further, rather than sending back the resulting data to the processor 102, the memory 104 may merely send back an acknowledgement (e.g., "Done"), indicating that the requested operation has been completed. As such, many compute operations, such as artificial intelligence operations (e.g., tensor operations involving matrix calculations) can be performed in memory 104, with minimal usage of the bus between the processor 102 and the memory 104. In some embodiments the media access circuitry 108 is included in the same die as the memory media 110. In other embodiments, the media access circuitry 108 is on a separate die but in the same package as the memory media 110. In yet other embodiments, the media access circuitry 108 is in a separate die and separate package but on the same dual in-line memory module (DIMM) or board as the memory media 110.

The processor 102 may be embodied as any device or circuitry (e.g., a multi-core processor(s), a microcontroller, or other processor or processing/controlling circuit) capable of performing operations described herein, such as executing an application (e.g., an artificial intelligence related application that may utilize a neural network or other machine learning structure to learn and make inferences). In some embodiments, the processor 102 may be embodied as, include, or be coupled to an FPGA, an application specific integrated circuit (ASIC), reconfigurable hardware or hardware circuitry, or other specialized hardware to facilitate performance of the functions described herein.

Figure 2:
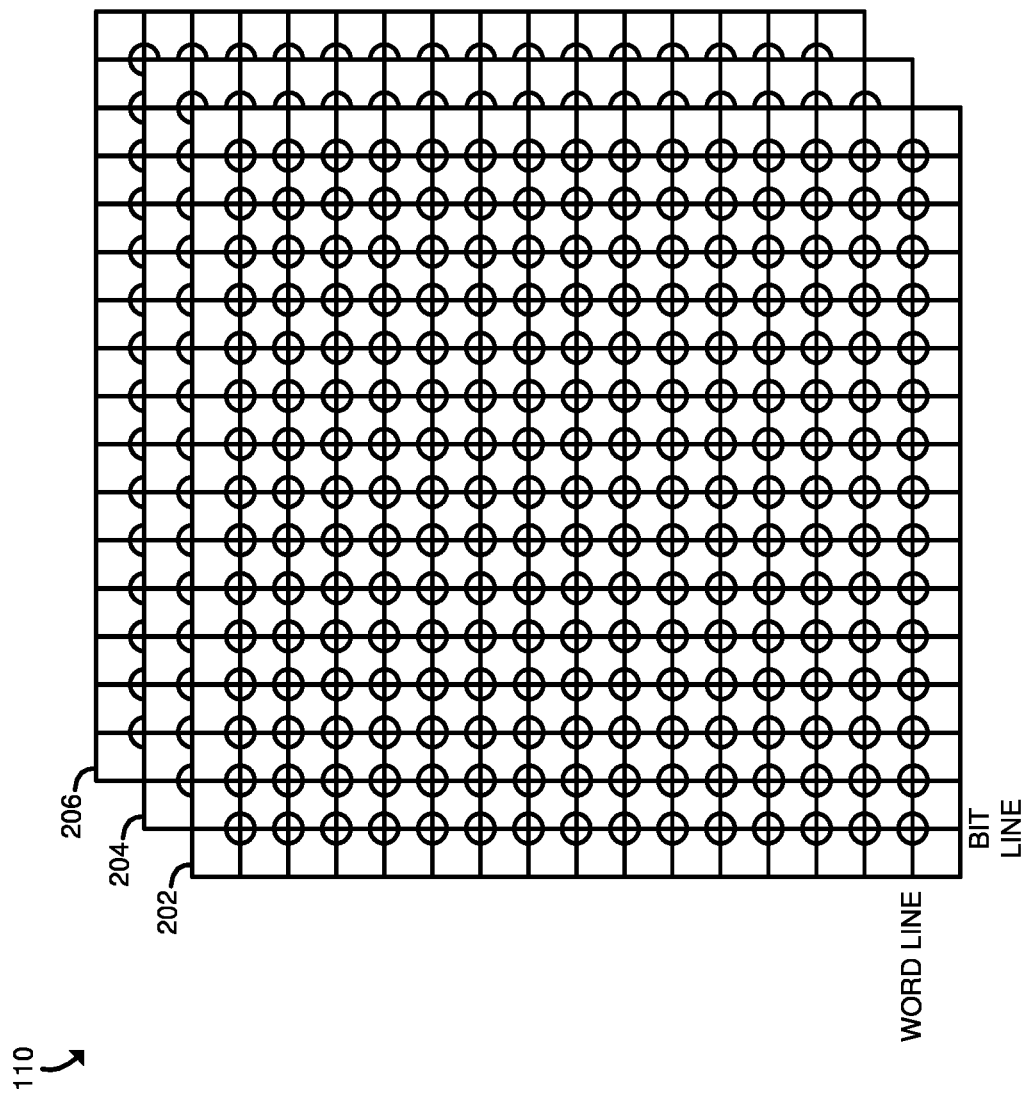
FIG. 2 is a simplified diagram of at least one embodiment of a memory media included in the compute device of FIG. 1.

The memory 104, which may include a non-volatile memory (e.g., a far memory in a two-level memory scheme), includes the memory media 110 and the media access circuitry 108 (e.g., a device or circuitry, such as integrated circuitry constructed from complementary metal-oxide-semiconductors (CMOS) or other materials) underneath (e.g., at a lower location) and coupled to the memory media 110. The media access circuitry 108 is also connected to the memory controller 106, which may be embodied as any device or circuitry (e.g., a processor, a co-processor, dedicated circuitry, etc.) configured to selectively read from and/or write to the memory media 110 and to perform tensor operations on data (e.g., matrix data) present in the memory media 110 (e.g., in response to requests from the processor 102, which may be executing an artificial intelligence related application that relies on tensor operations to train a neural network and/or to make inferences). Referring briefly to FIG. 2, the memory media 110, in the illustrative embodiment, includes a tile architecture, also referred to herein as a cross point architecture (e.g., an architecture in which memory cells sit at the intersection of word lines and bit lines and are individually addressable and in which bit storage is based on a change in bulk resistance), in which each tile (e.g., memory cell) is addressable by an x parameter and a y parameter (e.g., a column and a row). The memory media 110 includes multiple partitions, each of which includes the tile architecture. The partitions may be stacked as layers 202, 204, 206 to form a three-dimensional cross point architecture (e.g., Intel 3D XPoint™ memory). Unlike typical memory devices, in which only fixed-size multiple-bit data structures (e.g., byte, words, etc.) are addressable, the media access circuitry 108 is configured to read individual bits, or other units of data, from the memory media 110 at the request of the memory controller 106, which may produce the request in response to receiving a corresponding request from the processor 102.

Referring back to FIG. 1, the media access circuitry 108, in the illustrative embodiment, includes a tensor logic unit 130, which may be embodied as any device or circuitry (e.g., CMOS circuitry) configured to offload the performance of tensor operations from other portions of the media access circuitry 108. The tensor logic unit 130, in the illustrative embodiment, includes multiple memory scratch pads 132, each of which may be embodied as any device or circuitry (e.g., static random access memories (SRAMs), register files, etc.) usable to provide relatively fast (e.g., low latency) access to data (e.g., matrix data) that has been read from the memory media 110. In the illustrative embodiment, the scratch pads 132 provide faster read and write access times than the memory media 110 which has comparatively slower access times and a larger capacity. The tensor logic unit 130 additionally includes the compute-class error correction code (ECC) logic unit 134 discussed above. Additionally, in the illustrative embodiment, the tensor logic unit 130 includes multiple compute logic units 136 each of which may be embodied as any device or circuitry (e.g., reconfigurable circuitry, ASICs, etc.) configured to perform compute operations on data read from the memory media 110 (e.g., after the compute-class ECC logic unit 134 has performed an error correction process on the data).

Figure 3:
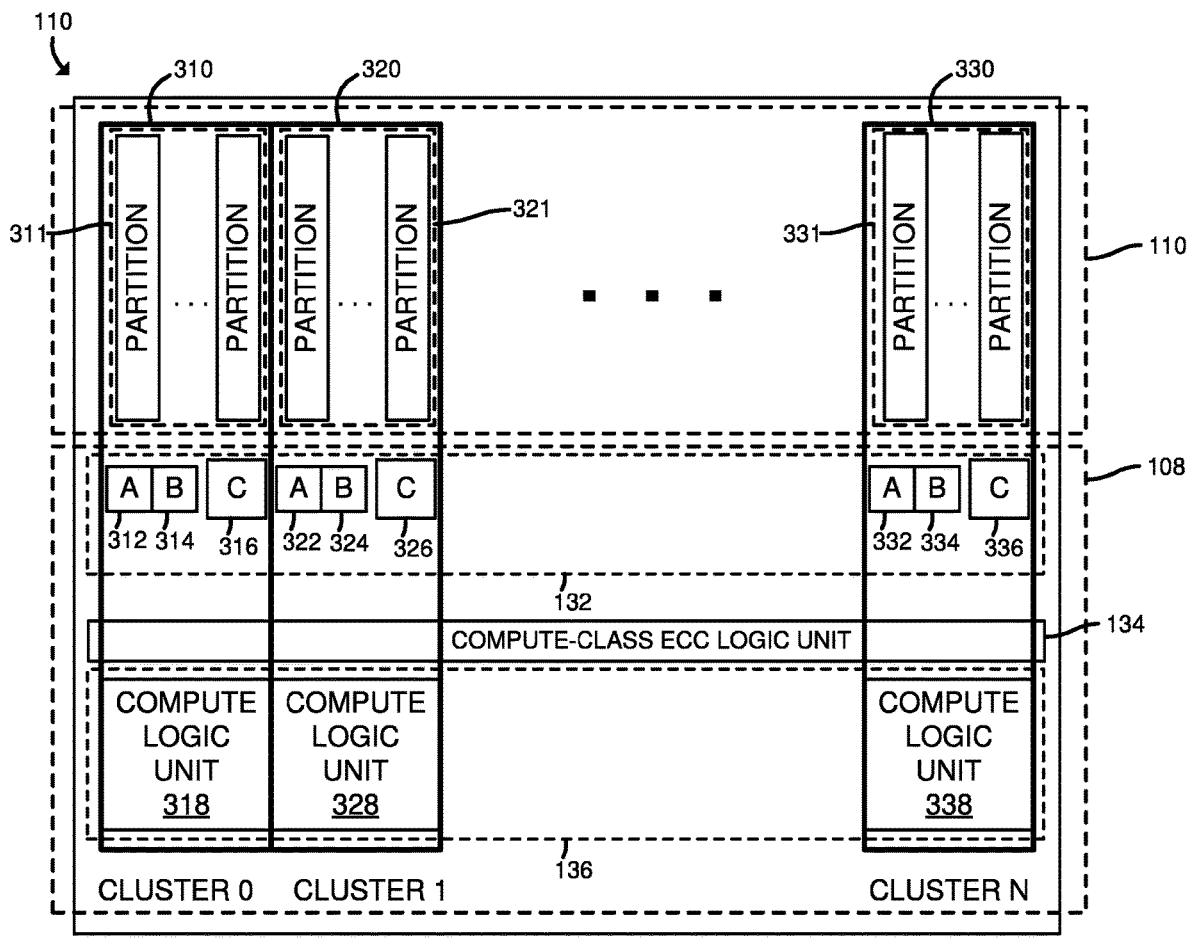
FIG. 3 is a simplified diagram of at least one embodiment of partitions of the memory media and components of a media access circuitry of a memory included in the compute device of FIG. 1.

Referring briefly to FIG. 3, in the illustrative embodiment, components of the memory 104 are divided into clusters 310, 320, 330 (e.g., groupings of components). The cluster 310 includes multiple partitions 311 of the memory media 110, a set of scratch pads 312, 314, 316, each similar to the scratch pads 132 of FIG. 1, and a corresponding compute logic unit 318, similar to the compute logic unit 136 of FIG. 1. Similarly, the cluster 320 includes another set of partitions 321 of the memory media 110, a corresponding set of scratch pads 322, 324, 326, and a corresponding compute logic unit 328. The cluster 330 also includes a set of partitions 331 of the memory media 110, a corresponding set of scratch pads 332, 334, 336, and a compute logic unit 338. In the illustrative embodiment, in operation, the compute logic unit 318 reads a subset of data (e.g., one value of an input matrix A from the set of partitions (e.g., partitions 311)) and provides the read data to the compute-class ECC logic unit 134 to perform an error correction process to correct any errors in the data. The compute logic unit 318 may additionally write the data (e.g., after the error correction process has been performed) into the corresponding scratch pad 312 and may broadcast that same subset of the matrix data to the corresponding scratch pads of the other clusters (e.g., to the scratch pads 322, 332). Similarly, the compute logic unit 328 may read, from the corresponding set of partitions 321 another subset of the matrix data (e.g., another value of the input matrix A) into the corresponding scratch pad 322, utilizing the compute-class ECC logic unit 134 to correct any errors, and broadcast that subset of the matrix data to the other scratch pads that are to store data for that matrix (e.g., to the scratch pads 312, 332). The compute logic unit 338 may perform similar operations.

By broadcasting, to the other scratch pads, matrix data that has been read from a corresponding set of partitions of the memory media 110, the media access circuitry 108 reduces the number of times that a given section (e.g., set of partitions) of the memory media 110 must be accessed to obtain the same matrix data (e.g., the read matrix data may be broadcast to multiple scratch pads after being read from the memory media 110 once, rather than reading the same matrix data from the memory media 110 multiple times).

Further, by utilizing multiple compute logic units 318, 328, 338 that are each associated with corresponding scratch pads 312, 314, 316, 322, 224, 226, 232, 234, 236, the media access circuitry 108 may perform the portions of a tensor operation (e.g., matrix multiply and accumulate) concurrently (e.g., in parallel). It should be understood that while three clusters 310, 320, 330 are shown in FIG. 3 for simplicity, the actual number of clusters and corresponding partitions, scratch pads, and compute logic units may differ depending on the particular embodiment.

Figure 4:
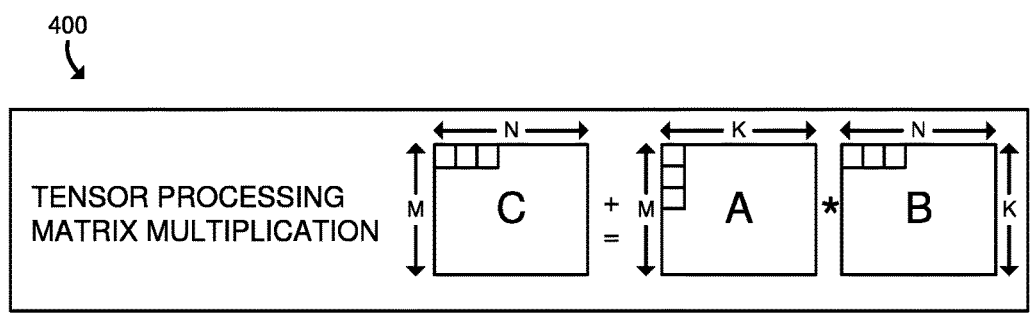
FIG. 4 is a simplified diagram of at least one embodiment of a tensor operation that may be performed in the memory of the compute device of FIG. 1.

Referring briefly to FIG. 4, an example of a matrix multiplication (e.g., matrix multiply and accumulate) operation 400 that may be performed by the memory 104 is shown. As illustrated, matrix data in an input matrix A is multiplied by matrix data in another matrix B (e.g., weight data for a layer of a convolutional neural network) and the resultant data is written to the output matrix C. Each matrix represented in FIG. 4 is temporarily stored as matrix data in the scratch pads 132 of the media access circuitry 108. In some embodiments, the output matrix C may be utilized as an input matrix for a subsequent tensor operation (e.g., as an input matrix for a subsequent layer of a convolutional neural network).

Referring back to FIG. 1, the memory 104 may include non-volatile memory and volatile memory. The non-volatile memory may be embodied as any type of data storage capable of storing data in a persistent manner (even if power is interrupted to the non-volatile memory). For example, the non-volatile memory may be embodied as one or more non-volatile memory devices. The non-volatile memory devices may include one or more memory devices configured in a cross point architecture that enables bit-level addressability (e.g., the ability to read from and/or write to individual bits of data, rather than bytes or other larger units of data), and are illustratively embodied as three-dimensional (3D) cross point memory. In some embodiments, the non-volatile memory may additionally include other types of memory, including any combination of memory devices that use chalcogenide phase change material (e.g., chalcogenide glass), ferroelectric transistor random-access memory (Fe-TRAM), nanowire-based non-volatile memory, phase change memory (PCM), memory that incorporates memristor technology, Magnetoresistive random-access memory (MRAM) or Spin Transfer Torque (STT)-MRAM. The volatile memory may be embodied as any type of data storage capable of storing data while power is supplied volatile memory. For example, the volatile memory may be embodied as one or more volatile memory devices, and is periodically referred to hereinafter as volatile memory with the understanding that the volatile memory may be embodied as other types of non-persistent data storage in other embodiments. The volatile memory may have an architecture that enables bit-level addressability, similar to the architecture described above.

The processor 102 and the memory 104 are communicatively coupled to other components of the compute device 100 via the I/O subsystem 112, which may be embodied as circuitry and/or components to facilitate input/output operations with the processor 102 and/or the main memory 104 and other components of the compute device 100. For example, the I/O subsystem 112 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 112 may form a portion of a system-on-a-chip (SoC) and be incorporated, along with one or more of the processor 102, the main memory 104, and other components of the compute device 100, in a single chip.

The data storage device 114 may be embodied as any type of device configured for short-term or long-term storage of data such as, for example, memory devices and circuits, memory cards, hard disk drives, solid-state drives, or other data storage device. In the illustrative embodiment, the data storage device 114 includes a memory controller 116, similar to the memory controller 106, a storage-class ECC logic unit 160, similar to the storage-class ECC logic unit 150, storage media 120, similar to the memory media 110, and media access circuitry 118, similar to the media access circuitry 108, including a tensor logic unit 140, similar to the tensor logic unit 130, scratch pads 142, similar to the scratch pads 132, a compute-class ECC logic unit 144, similar to the compute-class ECC logic unit 134, and compute logic units 146, similar to the compute logic units 136. As such, in the illustrative embodiment, the data storage device 114 is capable of performing multiple levels of error correction and performing compute operations on data stored in the storage media 120. The data storage device 114 may include a system partition that stores data and firmware code for the data storage device 114 and one or more operating system partitions that store data files and executables for operating systems.

The communication circuitry 122 may be embodied as any communication circuit, device, or collection thereof, capable of enabling communications over a network between the compute device 100 and another device. The communication circuitry 122 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 122 includes a network interface controller (NIC) 124, which may also be referred to as a host fabric interface (HFI). The NIC 124 may be embodied as one or more add-in-boards, daughter cards, network interface cards, controller chips, chipsets, or other devices that may be used by the compute device 100 to connect with another compute device. In some embodiments, the NIC 124 may be embodied as part of a system-on-a-chip (SoC) that includes one or more processors, or included on a multichip package that also contains one or more processors. In some embodiments, the NIC 124 may include a local processor (not shown) and/or a local memory (not shown) that are both local to the NIC 124. In such embodiments, the local processor of the NIC 124 may be capable of performing one or more of the functions of the processor 102. Additionally or alternatively, in such embodiments, the local memory of the NIC 124 may be integrated into one or more components of the compute device 100 at the board level, socket level, chip level, and/or other levels.

Figure 5:
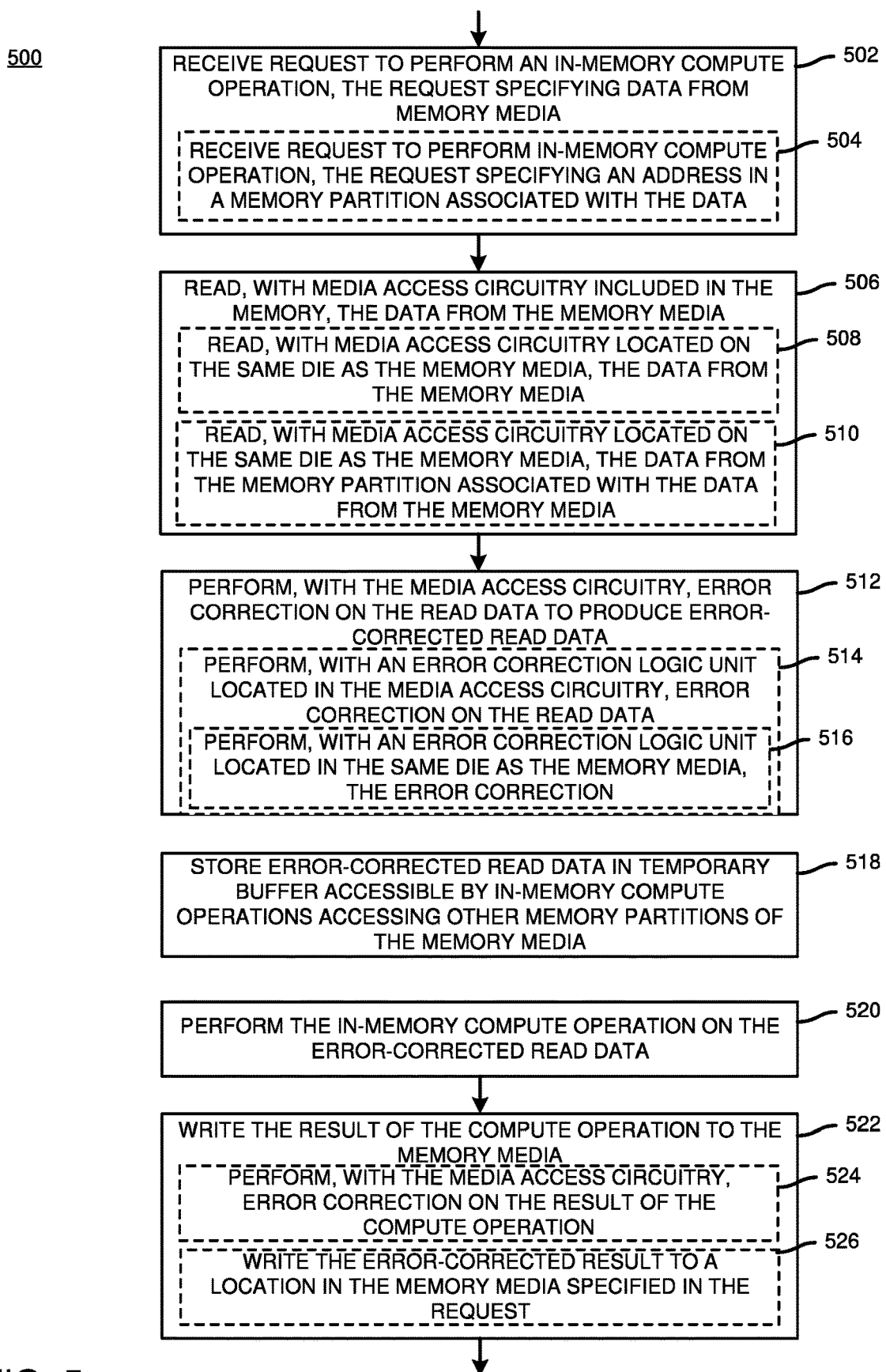
FIG. 5 is a simplified diagram of at least one embodiment of a method for provisioning error-corrected data for compute operations performed in the memory of the compute device of FIG. 1.

Referring now to FIG. 5, the compute device 100, in operation, may execute a method 500 for provisioning error corrected memory media data for in-memory compute operations. In this example, method 500 is carried out by the memory 104. However, one of skill in the art will recognize that the method 500 could be additionally or alternatively performed using the memory of the data storage device 114.

As shown, the method 500 begins in block 502, in which the compute device 100 receives a request to perform an in-memory compute operation. The in-memory compute operation may include any operation performed by the media access circuitry 108 on data located on-die, e.g., in the memory media 110. For example, the in-memory compute operation may correspond to a tensor operation (e.g., a matrix multiplication operation on data stored in the memory media 110) originating from the processor 102 and through the memory controller 106. The request may specify the data in the memory media 110 to be used in the compute operation. In particular, in block 504, the compute device 100 may receive the request, in which the request specifies an address in one of the memory partitions in the memory media 110 in which the data is located.

In block 506, the compute device 100 reads, with the media access circuitry 108, the data from the memory media. Particularly, in block 508, the compute device 100 may read, with the media access circuitry 108 that is located in the same die as the memory media 110, the data from the memory media 110. Further, in block 510, the data is read from a memory partition in which the data is located in the memory media 110. The memory partition may correspond to a partition of a cluster, such as the cluster 310. In reading the data, the media access circuitry 108 may read the data from a memory media (e.g., the memory media 110) having a cross point architecture (e.g., an architecture in which memory cells sit at the intersection of word lines and bit lines and are individually addressable and in which bit storage is based on a change in bulk resistance). Further, the media access circuitry 108 may read the data from a memory media (e.g., the memory media 110) having a three dimensional cross point architecture (e.g., an architecture in which sets of tiles are stacked as layers, as described with reference to FIG. 2).

In block 512, the compute device 100 performs, with the media access circuitry 108, error correction (e.g., an error correction algorithm) on the read data. For instance, in block 514, the media access circuitry 108 may do so via the compute-class ECC logic unit 134. In doing so, in block 516, the media access circuitry 108 performs, with the compute-class ECC logic unit 134, the error correction in the same die as the memory media 110. In performing error correction, the compute device 100 produces error-corrected read data, in which one or more errors in the read data, if any, are corrected. Further in doing so, the memory 104 performs the error correction with an error correction logic unit that is different from an error correction logic unit in the memory controller (e.g., the storage-class ECC logic unit 150). As a result, the media access circuity 108 may carry out the error correction without sending any data to the memory controller. In an embodiment, the memory 104 may perform the error correction with an error correction logic unit that is configured to operate on a differently sized data set than an error correction logic unit located in the memory controller 106 (e.g., the compute-class ECC logic unit 134 is configured to operate on a differently sized data set than the storage-class ECC logic unit 150). In addition, the memory 104 may perform the error correction with an error correction logic unit that is configured to execute a different error correction algorithm than an error correction logic unit located in the memory controller 106 (e.g., the compute-class ECC logic unit 134 may be configured to execute a BCH algorithm and the storage-class ECC logic unit 150 may be configured to execute a Reed-Solomon error correction algorithm).

In block 518, the compute device 518 stores the error-corrected read data in a temporary buffer. The temporary buffer is accessible by other in-memory compute operations, e.g., those operations accessing data in other memory partitions of the memory media in addition to the error-corrected read data. For instance, the temporary buffer may correspond to one or more scratch pads in the media access circuitry 108 (e.g., one or more of the scratch pads 132). The error-corrected read data may remain in the temporary buffer based on time (e.g., the data is removed from the temporary buffer after a predefined amount of time), based on an amount of data inserted into the buffer (e.g., the data may be removed on a FIFO based as additional data is stored in the buffer), and so on. Using the error-corrected data, the memory 104 may perform, with the media access circuitry 108, one or more in-memory compute operations on the error-corrected data (e.g., with the compute logic unit(s) 136). For example, the memory 104 may perform, with the media access circuitry 108, one or more tensor operations on the error-corrected data, such as one or more matrix multiplication operations. The matrix multiplication operation(s) may include one or more matrix multiply-accumulate operations (e.g., multiplying an input matrix A by a weight matrix B and accumulating into an output matrix C). Further, in addition to other in-memory compute operations, the memory 104 may provide the error-corrected data to a processor (e.g., the processor 102) of the compute device 100. In doing so, the memory 104 may provide the error-corrected data to a processor (e.g., the processor 102) executing an application (e.g., an application that relies on tensor operations to train a neural network and/or to make inferences).

In block 520, the compute device 100 performs the in-memory compute operation on the error-corrected read data. The compute device 100 may return the result of the in-memory compute operation to the requesting entity, such as the processor 102. While operations are described as being performed on specific data sizes (e.g., 512 bites, 2 kilobits, 4 kilobits), it should be understood that in other embodiments, the data sizes may be different. In block 522, the compute device 100 writes the result of the in-memory compute operation to the memory media 110. For instance, to do so, in block 524, the compute device 100 performs, with the media access circuitry 108, error correction on the result of the compute operation. The media access circuitry 108 may do so using the techniques described relative to performing error correction on the read data. Further, in block 526, the compute device 100 writes the error-corrected result to a location in the memory media 110, e.g., specified in the request.

EXAMPLES

Illustrative examples of the technologies disclosed herein are provided below. An embodiment of the technologies may include any one or more, and any combination of, the examples described below.

Example 1 includes a memory comprising a memory media comprising a plurality of memory partitions; media access circuitry coupled to the memory media, wherein the media access circuitry is to receive a request to perform a first in-memory compute operation on data from the memory media, the request specifying a first memory partition of the plurality of memory partitions of the memory media associated with the data; read the data from the first memory partition; perform error correction on the read data to produce error-corrected read data; and store the error-corrected read data in a temporary buffer for access by one or more second in-memory compute operations.

Example 2 includes the subject matter of Example 1, and wherein the media access circuitry is further to perform the first in-memory compute operation on the error-corrected read data.

Example 3 includes the subject matter of any of Examples 1 and 2, and wherein the media access circuitry is further to write a result of the first compute operation to the memory media.

Example 4 includes the subject matter of any of Examples 1-3, and wherein to write the result of the first compute operation to the memory media comprises to perform the error correction on the result of the compute operation.

Example 5 includes the subject matter of any of Examples 1-4, and wherein to write the result of the first compute operation to the memory media further comprises to write the error-corrected result to a location in the memory media specified in the request.

Example 6 includes the subject matter of any of Examples 1-5, and wherein to read the data from the first memory partition comprises to read the data from the first memory partition, the first memory partition located on a same die as the media access circuitry.

Example 7 includes the subject matter of any of Examples 1-6, and wherein to perform the error correction on the read data comprises to perform, with an error correction logic unit located in the media access circuitry, the error correction on the read data.

Example 8 includes the subject matter of any of Examples 1-7, and wherein to perform, with the error correction logic unit located in the media access circuitry, the error correction on the read data comprises to perform, with the error correction logic unit located in a same die as the memory media, the error correction.

Example 9 includes the subject matter of any of Examples 1-8, and wherein to store the error-corrected read data in the temporary buffer for access by the one or more second in-memory compute operations comprises to store the error-corrected read data in the temporary buffer for access by the one or more second in-memory compute operations, the one or more second in-memory compute operations further accessing one of the plurality of memory partitions.

Example 10 includes a method comprising receiving, by a media access circuitry coupled to a memory media having a plurality of memory partitions, a request to perform a first in-memory compute operation on data from the memory media, the request specifying a first memory partition of the plurality of memory partitions of the memory media associated with the data; reading, by the media access circuitry, the data from the first memory partition; performing, by the media access circuitry, error correction on the read data to produce error-corrected read data; and storing, by the media access circuitry, the error-corrected read data in a temporary buffer for access by one or more second in-memory compute operations.

Example 11 includes the subject matter of Example 10, and further including performing the first in-memory compute operation on the error-corrected read data.

Example 12 includes the subject matter of any of Examples 10 and 11, and further including writing a result of the first compute operation to the memory media.

Example 13 includes the subject matter of any of Examples 10-12, and wherein writing the result of the first compute operation to the memory media comprises performing the error correction on the result of the compute operation.

Example 14 includes the subject matter of any of Examples 10-13, and wherein writing the result of the first compute operation to the memory media further comprises writing the error-corrected result to a location in the memory media specified in the request.

Example 15 includes the subject matter of any of Examples 10-14, and wherein reading the data from the first memory partition comprises reading the data from the first memory partition, the first memory partition located on a same die as the media access circuitry.

Example 16 includes the subject matter of any of Examples 10-15, and wherein performing the error correction on the read data comprises performing, with an error correction logic unit located in the media access circuitry, the error correction on the read data.

Example 17 includes the subject matter of any of Examples 10-16, and wherein performing, with the error correction logic unit located in the media access circuitry, the error correction on the read data comprises performing, with the error correction logic unit located in a same die as the memory media, the error correction.

Example 18 includes the subject matter of any of Examples 10-17, and wherein storing the error-corrected read data in the temporary buffer for access by the one or more second in-memory compute operations comprises storing the error-corrected read data in the temporary buffer for access by the one or more second in-memory compute operations, the one or more second in-memory compute operations further accessing one of the plurality of memory partitions.

Example 19 includes one or more machine-readable storage media comprising a plurality of instructions stored thereon that, in response to being executed, cause media access circuitry coupled to a memory media having a plurality of memory partitions included in a memory to receive a request to perform a first in-memory compute operation on data from the memory media, the request specifying a first memory partition of the plurality of memory partitions of the memory media associated with the data; read the data from the first memory partition; perform error correction on the read data to produce error-corrected read data; and store the error-corrected read data in a temporary buffer for access by one or more second in-memory compute operations.

Example 20 includes the subject matter of Example 19, and wherein to store the error-corrected read data in the temporary buffer for access by the one or more second in-memory compute operations comprises to store the error-corrected read data in the temporary buffer for access by the one or more second in-memory compute operations, the one or more second in-memory compute operations further accessing one of the plurality of memory partitions.

The invention claimed is:

1. A memory comprising:
   a memory media to include a plurality of memory partitions; and
   media access circuitry to couple to the memory media, wherein the media access circuitry is to:
      receive a request to perform a first in-memory compute operation on data from the memory media, the first in-memory compute operation on the data to include a first matrix calculation, the request specifying a first memory partition of the plurality of memory partitions of the memory media associated with the data for which the first in-memory compute operation is to be performed on by the media access circuitry;
      read the data from the first memory partition;
      perform error correction on the read data to produce error-corrected read data; and
      store the error-corrected read data in a temporary buffer for use to perform a second in-memory compute operation by the media access circuitry, the second in-memory compute operation on the error-corrected read data to include a second matrix calculation.

2. The memory of claim 1, wherein the media access circuitry is further to perform the first in-memory compute operation using the error-corrected read data.

3. The memory of claim 2, wherein the media access circuitry is further to write a result of the first in-memory compute operation to the memory media.

4. The memory of claim 3, wherein to write the result of the first in-memory compute operation to the memory media comprises to perform error correction on the result of the first in-memory compute operation prior to writing the result to the memory media.

5. The memory of claim 4, wherein to write the result of the first in-memory compute operation to the memory media further comprises to write the error-corrected result to a location in the memory media specified in the request to perform the first in-memory compute operation.

6. The memory of claim 1, comprising the first memory partition located on a same die as the media access circuitry.

7. The memory of claim 1, wherein to perform the error correction on the read data comprises to perform, with an error correction logic unit located in the media access circuitry, the error correction on the read data.

8. The memory of claim 7, wherein to perform, with the error correction logic unit located in the media access circuitry, the error correction on the read data comprises to perform, with the error correction logic unit located in a same die as the memory media, the error correction.

9. The memory of claim 1, wherein to store the error-corrected read data in the temporary buffer for access by the second in-memory compute operation comprises to store the error-corrected read data in the temporary buffer for use to perform the second in-memory compute operation, the second in-memory compute operation further to access data maintained in a second memory partition of the plurality of memory partitions.

10. A method comprising:
    receiving, by a media access circuitry coupled to a memory media having a plurality of memory partitions, a request to perform a first in-memory compute operation on data from the memory media, the first in-memory compute operation on the data to include a first matrix calculation, the request specifying a first memory partition of the plurality of memory partitions of the memory media associated with the data for which the first in-memory compute operation is to be performed on by the media access circuitry;
    reading, by the media access circuitry, the data from the first memory partition;
    performing, by the media access circuitry, error correction on the read data to produce error-corrected read data; and
    storing, by the media access circuitry, the error-corrected read data in a temporary buffer for use to perform a second in-memory compute operation by the media access circuitry, the second in-memory compute operation on the error-corrected read data to include a second matrix calculation.

11. The method of claim 10, further comprising performing the first in-memory compute operation using the error-corrected read data.

12. The method of claim 11, further comprising writing a result of the first in-memory compute operation to the memory media.

13. The method of claim 12, wherein writing the result of the first in-memory compute operation to the memory media comprises performing error correction on the result of the first in-memory compute operation prior to writing the result to the memory media.

14. The method of claim 13, wherein writing the result of the first in-memory compute operation to the memory media further comprises writing the error-corrected result to a location in the memory media specified in the request to perform the first in-memory compute operation.

15. The method of claim 10, comprising the first memory partition located on a same die as the media access circuitry.

16. The method of claim 10, wherein performing the error correction on the read data comprises performing, with an error correction logic unit located in the media access circuitry, the error correction on the read data.

17. The method of claim 16, wherein performing, with the error correction logic unit located in the media access circuitry, the error correction on the read data comprises performing, with the error correction logic unit located in a same die as the memory media, the error correction.

18. The method of claim 10, wherein storing the error-corrected read data in the temporary buffer for access by the second in-memory compute operation comprises storing the error-corrected read data in the temporary buffer for use to perform the second in-memory compute operation, the second in-memory compute operation further to access data maintained in a second memory partition of the plurality of memory partitions.

19. One or more machine-readable storage media comprising a plurality of instructions stored thereon that, in response to being executed, cause media access circuitry coupled to a memory media having a plurality of memory partitions included in a memory to:
  receive a request to perform a first in-memory compute operation on data from the memory media, the first in-memory compute operation on the data to include a first matrix calculation, the request specifying a first memory partition of the plurality of memory partitions of the memory media associated with the data for which the first in-memory compute operation is to be performed on by the media access circuitry;
  read the data from the first memory partition;
  perform error correction on the read data to produce error-corrected read data; and
  store the error-corrected read data in a temporary buffer for use to perform a second in-memory compute operation by the media access circuitry, the second in-memory compute operation on the error-corrected read data to include a second matrix calculation.

20. The one or more machine-readable storage media of claim 19, wherein to store the error-corrected read data in the temporary buffer for access by the second in-memory compute operation comprises to store the error-corrected read data in the temporary buffer for use to perform the second in-memory compute operation, the second in-memory compute operation further to access data maintained in a second memory partition of the plurality of memory partitions.

* * * * *